United States Patent [19]

Kadota

[11] Patent Number: 4,604,595
[45] Date of Patent: Aug. 5, 1986

[54] SURFACE ACOUSTIC WAVE DEVICE HAVING INTERDIGITATED COMB ELECTRODES WEIGHTED FOR ODD/EVEN RESPONSE

[75] Inventor: Michio Kadota, Nagaokakyo, Japan

[73] Assignee: Murata Manufacturing Co., Ltd., Japan

[21] Appl. No.: 504,271

[22] Filed: Jun. 14, 1983

[30] Foreign Application Priority Data

Jun. 16, 1982 [JP] Japan .................................. 57-104391
Dec. 29, 1982 [JP] Japan .................................. 57-227919
Dec. 29, 1982 [JP] Japan .................................. 57-227920

[51] Int. Cl.$^4$ ............................................. H03H 9/25
[52] U.S. Cl. ........................................ 333/196; 333/154; 310/313 C
[58] Field of Search ............... 333/193, 194, 195, 196, 333/150, 151, 152, 153, 154; 310/313 R, 313 B, 313 C, 313 D

[56] References Cited

U.S. PATENT DOCUMENTS

| 4,160,219 | 7/1979 | Kuny | 310/313 C X |
| 4,206,380 | 6/1980 | Hazama et al. | 333/196 X |
| 4,420,728 | 12/1983 | Bower | 333/196 X |

FOREIGN PATENT DOCUMENTS

| 2532357 | 2/1976 | Fed. Rep. of Germany | 333/150 |
| 1351286 | 4/1974 | United Kingdom | 333/196 |

Primary Examiner—Eugene R. LaRoche
Assistant Examiner—Benny Lee
Attorney, Agent, or Firm—Ostrolenk, Faber, Gerb & Soffen

[57] ABSTRACT

A surface acoustic wave device disclosed herein has input and output electrodes (21, 22) one of which (21) comprises a first interdigital electrode (23) defining even components of a frequency response and a second interdigital electrode (24) defining odd components thereof, the second interdigital electrode (24) being disposed outside the envelope of the first interdigital electrode (23). A portion of the second interdigital electrode (24) is disposed within a non-overlapping region of the first interdigital electrode (23), that is a region outside the envelope of the first interdigital electrode (23) and especially a region environed with a straight line running through the top of the envelope in a direction parallel with the propagating direction of the surface waves.

18 Claims, 25 Drawing Figures $\frac{\lambda_o}{4}$

SURFACE ACOUSTIC WAVE DEVICE HAVING INTERDIGITATED COMB ELECTRODES WEIGHTED FOR ODD/EVEN RESPONSE

BACKGROUND OF THE INVENTION

1. Field of the Invention

This invention relates to a surface acoustic wave device and, more particularly, it relates to a surface acoustic wave device having a non-symmetrical frequency response characteristic with respect to the central frequency, for use, for example, in a video intermediate frequency circuit of a television receiver.

2. Description of the Prior Art

A typical surface acoustic wave filter has been put into practical use which comprises a transducer including a piezoelectric material, for example, piezoelectric ceramic of, for example, PZT, a single crystal of such as $LiNbO_3$ or a piezoelectric thin film such as ZnO and input side and output side electrodes disposed on a surface of the piezoelectric material. At least one of the input side and output side electrodes takes the form of an interdigital electrode. The interdigital electrode comprises a set of comb-shaped electrodes, each comb-shaped electrode having a plurality of electrode fingers and a common electrode for commonly connecting those electrode fingers at one end thereof. The set of comb-shaped electrodes is disposed such that the plurality of electrode fingers of one of the comb-shaped electrodes lie in an interdigital manner with those of the other comb-shaped electrode.

Due to the fact that of the surface acoustic wave filter is small in size and requires no adjustment, it has been utilized in a wide range of equipment. Of late, such a surface acoustic wave filter has widely been used as filter in the video intermediate frequency circuit of television receivers. As is well known, a filter for use in the video intermediate frequency circuit of the television receiver must include a sound trap, etc. It is therefore necessary to provide a filter having a frequency response characteristic that is non-symmetrical with respect to the central frequency, i.e., a frequency $f_0$ intermediate between the adjacent channel picture carrier frequency and the adjacent channel sound carrier frequency.

One conventional way to provide a surface acoustic wave filter having a non-symmetrical frequency response characteristic through the weighting technique is to change the overlapping length and the center-to-center distance between the two adjacent electrode fingers, i.e., the electrode pitch, in the propagating direction of the surface acoustic wave. Such an interdigital electrode may be referred to as a variable pitch type. More particularly, if a non-symmetrical frequency characteristic required for the video intermediate frequency filter, for example, is subjected to a Fourier reverse conversion, then an impulse response characteristic as depicted in FIG. 1 is provided. The resulting impulse response characteristic includes an imaginary part as a result of Fourier reverse conversion and the time period between the respective peak points of real part where the imaginary part is zero is unequal, because of the non-symmetry of the frequency response characteristic. With the design of the interdigital electrodes in association with the resulting impulse response characteristic, the surface acoustic wave filter is enable to manifest a desired frequency characteristic. This design may be achieved by proper selection of the overlapping length of the adjacent electrode fingers, i.e., the surface acoustic wave exciting and receiving region, and proper selection of the electrode pitch, the former being selected to be proportional to the amplitude of a respective one of peaks (as denoted by the arrows) in the impulse response characteristic and the latter being selected to be proportional to the period between the adjacent peak points in the impulse response characteristic. As is understood from FIG. 1, the surface acoustic wave filter thus obtained has the interdigital electrodes of unequal electrode pitches and thus is of a so-called variable pitch type because of non-uniformity of the time period between the respective peak points where the imaginary part is zero.

Although the conventional approach using the variable pitch type interdigital electrodes is successful in attaining a non-symmetrical frequency characteristic, it has the outstanding problems that electrode patterns are difficult to design due to unequal pitches of the electrodes and the electrodes are easily broken or short-circuited in high frequency applications due to mixture of wide and narrow electrode fingers.

Several approaches have been proposed in an attempt to overcome the above problems in attaining a non-symmetrical frequency characteristic with the aid of the interdigital electrodes of equal pitch. One of those approaches is an odd/even function method and another one is a mirror method or reflection method as will be discussed below.

The former method or the odd/even function method assumes that $H_2(\omega)$ meets a precondition $H_1(\omega - \omega_0) = H_2(\omega_0 - \omega)$, wherein $H_1(\omega)$ is the linear representation of a desired frequency characteristic. The correlation between $H_1(\omega)$ and $H_2(\omega)$ is illustrated in FIGS. 2A and 2B. Assuming $H_R(\omega)$ is the even component and $H_I(\omega)$ is the odd component with the following definitions thereof, those components are correlated as shown in FIGS. 3A and 3B.

$$H_R(\omega) = \frac{H_1(\omega) + H_2(\omega)}{2} \quad (1)$$

$$H_I(\omega) = \frac{H_2(\omega) - H_1(\omega)}{2j} \quad (2)$$

From equations (1) and (2), $H_1(\omega)$ may be rewritten as follows:

$$H_1(\omega) = H_R(\omega) - jH_I(\omega) \quad (3)$$

The impulse response characteristic is a Fourier conversion of the above equation (3), with the following definition.

$$h(t) = h_R(t) - jh_I(t) \quad (4)$$
$$= \int H_R(\omega)e^{j(2\pi ft + \phi)}df - \int jH_I(\omega)e^{j(2\pi ft + \phi)}df$$

The impulse response characteristics as defined by $h_R(t)$ and $-jh_I(t)$ in equation (4) are plotted with the solid line and the dotted line, respectively, in FIG. 4 where the sampling interval is $t = \frac{1}{2}f_0$. A review of the two impulse response characteristic curves in FIG. 4 indicate that the peak-to-peak interval is $\frac{1}{2}2f_0$, which is proportional to $\lambda_0/2$ in terms of wavelength, and the respective peaks in one of the curves align exactly with the center of the peak-to-peak intervals of the other curve. It is pointed out that the interdigital electrode corresponding to the impulse response characteristic as depicted by the solid line defines the even components and that the interdigital electrode corresponding to the impulse response characteristic as depicted by the dotted line defines the odd components.

An electrode pattern as shown in FIG. 6 is an electrode pattern formed by dividing the interdigital electrodes into two rows 2 and 3 in conformance to the two impulse response curves shown in FIG. 4 and electrically connecting the interdigital electrodes in parallel. This is fully disclosed in an article entitled "One Approach to Design Surface Acoustic Wave Filter" by Nakamura and Shimizu (172nd Acoustics Symposium, Electrical Communication Institute of Tohoku University issued on Sept. 28, 1972).

In FIG. 6, there is shown a set of interdigital electrodes 1 and 4. Electrode 1 is defined by two interdigital electrodes 2 and 3 disposed in a direction normal to the wave propagating direction, with electrode 3 excites and receives either the even or odd components and the electrode 2 excites and receives the other of the even or odd components. The electrode 4 is adapted to cover paths for waves between the two electrodes 2 and 3.

The electrode pattern of FIG. 6 is however disadvantageous in that the region for exciting and receiving the surface waves extend through a surface wave substrate and the substrate must be large because the electrode 1 includes the two interdigital electrodes which extend in a direction perpendicular to the propagating direction. Furthermore, the electrode pattern is undesirable from the viewpoint of a pattern layout due to the fact that the regions where the intensity of exciting and receiving the surface waves is high, i.e., overlapping length is long, are located on both side portions and the common electrode is located at the center of the electrode pattern.

One way to avoid the above problems is to combine the two impulse response characteristics into a single one as plotted in FIG. 5 and form an electrode pattern in conformance to such combined response characteristic as indicated in FIGS. 7A and 7B. This method assures a non-symmetrical frequency characteristic with the interdigital electrodes of the same pitch. Referring to FIGS. 7A and 7B, one of the interdigital electrodes 5 is formed by main electrode fingers 6, 7, 8 and 9 each having an electrode width of $\lambda_0/8$ and spaced at an electrode pitch of $\lambda_0/4$ the two adjacent main electrode fingers being connected to common portions held at different potentials, respectively, and having different lengths and auxiliary electrode fingers 10, 11, 12 and 13 each having an electrode with of $\lambda_0/8$ and spaced at an electrode pitch of $\lambda_0/4$ and furthermore facing against free ends of the respective main electrode fingers and being connected to the common portions held at the different potentials.

With the interdigital electrode design of FIG. 7, the even component is excited and received by a region where the adjacent main electrode fingers 7 and 8, which are at different potentials overlap with each other in the lengthwise direction of the electrode fingers (as defined by the right upward hatching regions), whereas the odd component is excited and received by a region where the main electrode fingers 6 and 9 and the adjacent auxiliary electrode fingers 11 and 12 cross with each other (as denoted by the right downward hatching regions), the odd component being excited and received with a distance deviation of $\lambda/4$ with respect to the even component. With such an interdigital electrode design, it is possible to reduce the length of the electrodes in a direction normal to the propagating direction of the surface waves and therefore minimize the dimension of the surface wave substrate. However, because the surface waves are excited and received at regions where the respective electrode fingers 6 and 7 cross with the electrode fingers 8 and 9, respectively, (as defined by the cross hatching regions), there is an error in the frequency characteristic and design based upon prediction of such error is a troublesome task. To make the influence of the excitation and receipt between the electrode fingers 6 and 8 and between the electrode fingers 7 and 9 negligible, the tips of the intervening electrode fingers 7 and 11 and 8 and 12 should be disposed more closely to each other to reduce the area of the regions defined by the cross hatching lines. This approach, however, would increase the risk that the two fingers 7 and 11 and 8 and 12 would be short-circuited at their tip portions during formation of the electrode pattern. Because of different lengths of the respective electrode fingers in the electrode sets, it is not possible to provide a surface acoustic wave filter which manifests a non-symmetrical frequency response, using electrodes of the single finger type.

The latter method or the reflection method or the mirror method is fully discussed, for example, in ELECTRONICS LETTERS 28th Nov. 18, 1974, Vol. 10 No. 24 "Synthesis of Surface-Acoustic-Wave-Filters Using Double Electrodes" and U.S. Pat. No. 3,968,461. Briefly described, the mirror method assumes a virtual image of a central frequency $3f_0$ which is symmetrical with respect to $2f_0$, wherein $f_0$ is the central frequency of a desired frequency characteristic. The resulting impulse response characteristic is similar to that available through the odd/even function method. The electrode pattern may also be similar to those as indicated in FIGS. 7A and 7B. This, however, suggests that the mirror method involves the same problems as with the surface acoustic wave filters as shown in FIGS. 7A and 7B.

A surface acoustic wave device disclosed in U.S. Pat. No. 3,968,461 which attains a non-symmetrical frequency characteristic is fabricated as follows. A plurality of interdigital electrodes are disposed at an interval equal to half of the wavelength of the surface acoustic waves corresponding to a frequency $2f_0$, at least some of which are arranged in sets with the two electrodes in each set are electrically connected in common. At least some of those electrode sets are held in different overlapping state from the respective adjacent electrode sets such that the frequency response characteristics of the interdigital electrodes centering at the frequencies $f_0$ and $3f_0$ as a whole correspond to a Hermitian function and individually correspond to a non-Hermitian function. Because of different lengths of the respective electrode fingers in the electrode sets, it is not possible to provide a surface acoustic wave filter which manifests a non-symmetrical frequency response, using electrodes of the single finger type.

SUMMARY OF THE INVENTION

In a broad aspect of the present invention, there is provided a surface acoustic wave device which comprises a substrate for propagating surface acoustic waves and input side and output side electrodes disposed on the substrate, at least one of the input side and output side electrodes comprising a first interdigital electrode having an overlapping length along the direction of electrode fingers so weighted as to define one of even and odd components of a frequency characteristic and a second interdigital electrode partly disposed at a non-overlapping region of the first interdigital electrode and having an overlapping length so weighted as to define the other of the even and odd components of the frequency characteristic.

The term "non-overlapping region" used herein defines a region outside the envelope of the first interdigital electrode and especially a region environed with a straight line running through the top of the envelope in a direction parallel to the propagating direction of the surface waves.

In a specific embodiment of the present invention, the second interdigital electrode has at least one exciting source disposed in the neighborhood of a zero exciting source having the maximum overlapping length in the first interdigital electrode. It is further desirable that exciting sources other than said zero exciting source of the second interdigital electrode be disposed closer to the first interdigital electrode as to assure the maximum exciting intensity at the non-overlapping region of the first interdigital electrode in a direction normal to the propagating direction of the surface waves.

In a preferred embodiment, the second interdigital electrode includes a plurality of zero exciting sources each of which is distributed in a direction normal to the propagating direction of the surface waves.

It is an object of the present invention to provide a surface acoustic wave device which overcomes the prior art problems and assures a desired non-symmetrical frequency characteristic with the design of an electrode pattern in conformance to an impulse response characteristic as well as eliminating the fatal disadvantage of the mirror method, i.e., an error described above.

It is another object of the present invention to provide a surface acoustic wave device which can be structured by using electrodes of either a double finger type or a single finger type.

It is still another object of the present invention to provide a surface acoustic wave device which may be drastically reduced in size as a whole.

It is a further object of the present invention to provide a surface acoustic wave device which may suppress diffraction loss.

Other objects, features, aspects and advantages of the present invention will become more apparent from the following detailed description of the present invention when taken in conjunction with the accompanying drawings.

BRIEF DESCRIPTION OF THE DRAWINGS

FIGS. 8, 9 and 10 are plan views of a surface acoustic wave filter according to a first embodiment of the present invention; wherein FIG. 8 shows a pattern wherein a second interdigital electrode is disposed on only one side of a first interdigital electrode; FIG. 9 shows a second interdigital electrode disposed on both sides of the first interdigital electrode; and FIG. 10 shows an electrode pattern wherein interdigital electrodes include electrode fingers of the double finger type;

FIGS. 11, 12 and 13 are plan views of a surface acoustic wave filter according to a second embodiment of the present invention; wherein FIG. 11 illustrates an electrode pattern wherein a second interdigital electrode is disposed on only one side of a first interdigital electrode; FIG. 12 illustrates a pattern wherein a second interdigital electrode disposed on both sides of the first interdigital electrode; and FIG. 13 illustrates another electrode pattern wherein electrode fingers of the so-called double finger type are used;

FIGS. 15 and 16 are plan views showing a third embodiment of the present invention; wherein FIG. 15 illustrates an electrode pattern wherein interdigital electrodes include electrode fingers of a single finger type; and FIG. 16 illustrates an electrode pattern wherein interdigital electrodes include electrode fingers of the double finger type;

FIGS. 18 through 20 are plan views showing a surface acoustic wave filter according to a fourth embodiment of the present invention; wherein FIG. 18 illustrates an electrode pattern wherein interdigital electrodes include electrode fingers of the single finger type; FIG. 19 illustrates an electrode pattern of interdigital electrodes wherein electrode fingers are of the double finger type; and FIG. 20 illustrates an electrode pattern of interdigital electrodes wherein zero exciting sources are formed by provision of electrode portions not connected to common electrodes; and FIGS. 21 and 22 are plan views showing a surface acoustic wave filter according to a fifth embodiment of the present invention; wherein FIG. 21 illustrates an electrode pattern of interdigital electrodes wherein electrode fingers are of the double finger type; and FIG. 22 illustrates an electrode pattern of interdigital electrodes wherein electrode fingers are of the single finger type.

DESCRIPTION OF THE PREFERRED EMBODIMENTS

Figure 2A:
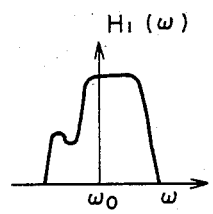
FIGS. 2A and 2B show the frequency characteristics $H_1(\omega)$ and $H_2(\omega)$ for use in explanation of the background of the present invention.
Figure 2B:
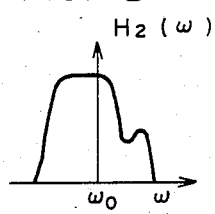
Figure 3A:
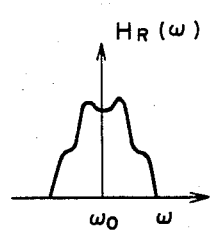
FIGS. 3A and 3B show the frequency characteristics of the symmetrical component $H_R(\omega)$ and the non-symmetrical component $-jH_I(\omega)$ of the frequency characteristic $H_1(\omega)$.
Figure 3B:
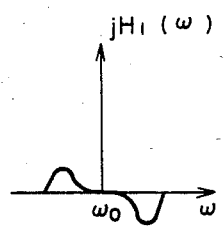
Figure 4:
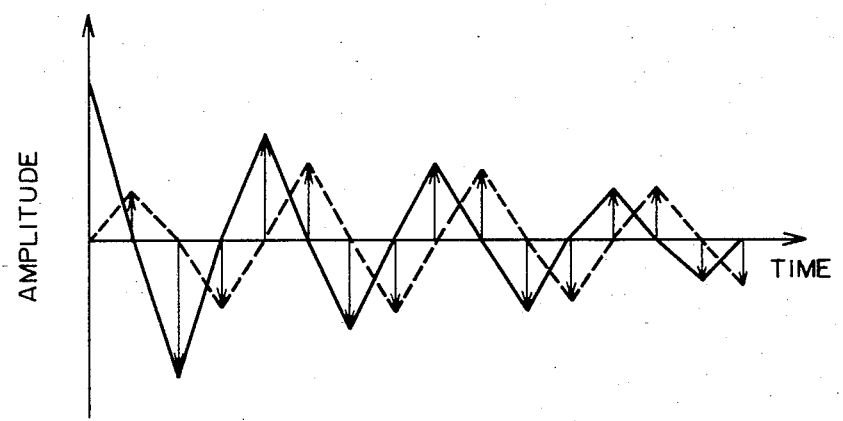
FIG. 4 shows an impulse response characteristic of $H_R(\omega)$ and $-jH_I(\omega)$, wherein the solid line denotes $H_R(\omega)$ and the dot line denotes $-jH_I(\omega)$.
Figure 5:
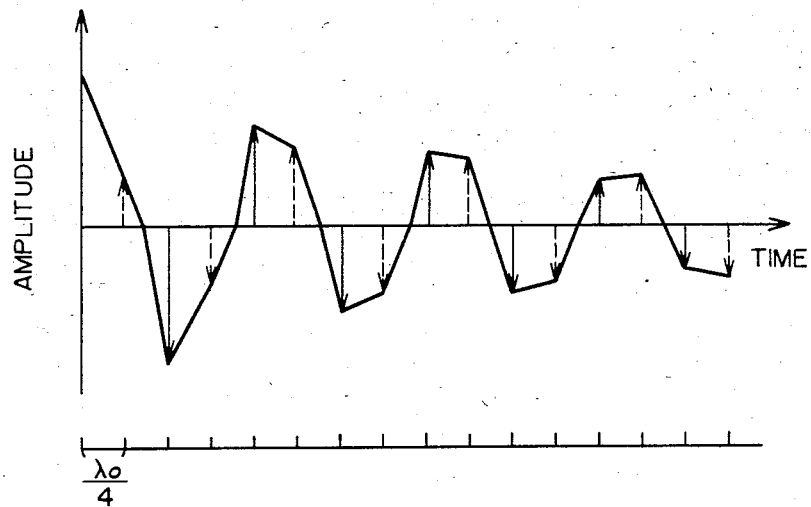
FIG. 5 shows an impulse response characteristic of a composition of $H_R(\omega)$ and $-jH_I(\omega)$.
Figure 6:
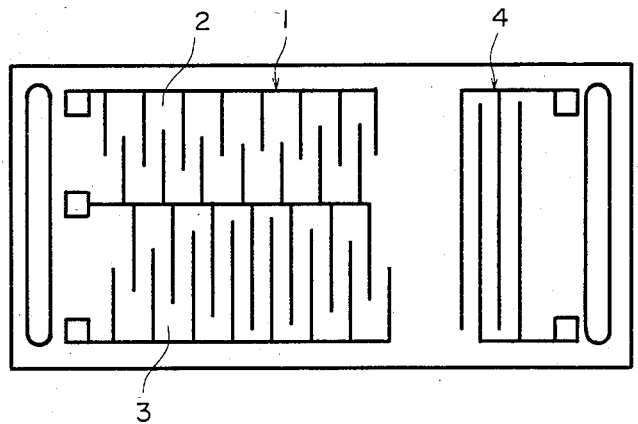
FIG. 6 shows an example of an electrode pattern of an interdigital electrode for use in a conventional surface wave filter which is of interest to the present invention.

The present invention also utilizes the impulse response characteristic curve shown in FIG. 5 and referred to the description of the prior art in determine the electrode pattern. Since the impulse response characteristic shown in FIG. 5 was fully described previously with reference to FIGS. 2 to 4, it will not be described again.

Figure 8:
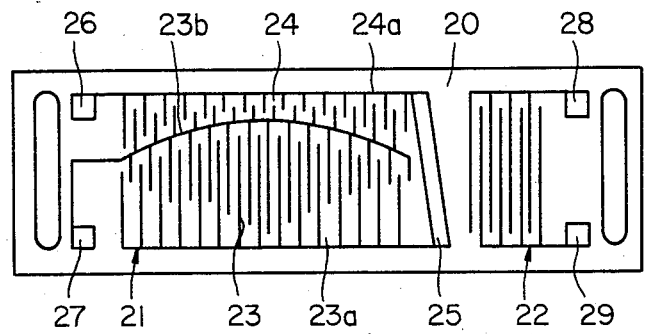

FIG. 8 is a plan view showing a surface acoustic wave filter according to an embodiment of the present invention. The surface acoustic wave filter includes input side and output side electrodes 21 and 22 disposed laterally of one another along the propagating direction (the horizontal direction as viewed in the figure) of the acoustic waves traveling between the electrodes 23, 24 on a surface wave substrate 20 of typically LiNbO₃, PZT or a ZnO thin film on glass plate. Each of the interdigital electrodes 21 and 22 may behave as either an input side electrode or an output side electrode. The input side electrode comprises first and second interdigital electrodes 23 and 24. The first interdigital electrode 23 has an overlapping length along the direction of electrode fingers, the overlapping length being weighted in a conventional manner in conformance to the impulse response characteristic defining the even components in FIG. 4 (as indicated by the solid lines). One electrode portion of two common electrode portions 23a and 23b is disposed substantially along the weighted envelope.

The second interdigital electrode 24 is disposed within a non-overlapping region of the first interdigital electrode 23, that is, a region that is positioned outside the common electrode portion 23b of the first interdigital electrode 23 to extend on or somewhat spaced from propagation paths in the first interdigital electrode 23. As noted above, the "non-overlapping region" of the first interdigital electrode 23 means a region outside the envelope of the first interdigital electrode 23 and especially a region environed with a straight line running through the top of this envelope in a direction parallel with the propagating direction of the surface waves.

The second interdigital electrode 24 includes electrode fingers extending from the common electrode portion 23b of the first interdigital electrode 23 and a separate common electrode portion 24a disposed in the proximity of the maximum overlapping length section of the first interdigital electrode 23, the electrode fingers being weighted in overlapping length in conformance to the impulse response characteristic which specifies the odd components in FIG. 4 (as indicated by the dot lines). The common electrode portion 24a of the second electrode 24 and the common electrode portion 23a of the first electrode 23 are connected by means of a shield electrode 25. Terminal electrodes 26, 27, 28 and 29 are disposed at four corners of the substrate 20 and connected to its associated common electrode portions.

Figure 9:
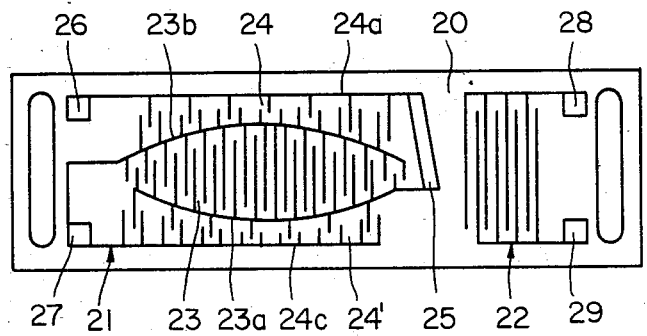

FIG. 9 shows a modification in the first embodiment of the present invention, wherein the second electrode 24 specifying the odd components is disposed on both sides of the first electrode 23. In other words, the common electrode portion 23a of the first electrode 23 is also curved substantially along the weighted envelope and an additional common electrode portion 24c extending in the proximity of the maximum overlapping length of the first electrode 23 is provided outside the envelope. An interdigital electrode 24' is set up by electrode fingers extending from the common electrode portions 23a and 24c. The common electrode portion 23b and the common electrode portion 24c are connected outside the electrodes. These electrodes 24 and 24' establish the second electrode specifying the odd components.

Figure 7A:
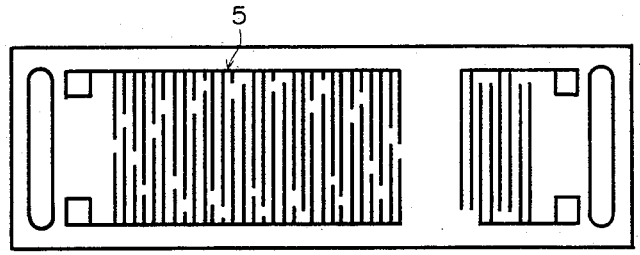
FIG. 7A shows another example of the electrode pattern of the interdigital electrode in the conventional surface wave filter.
Figure 7B:
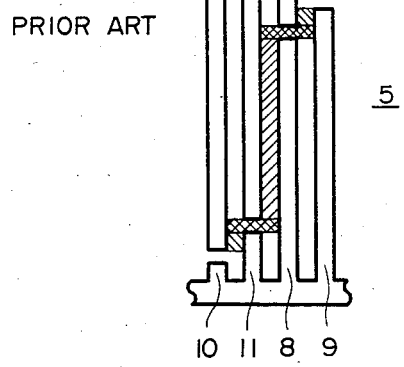
FIG. 7B is an enlarged view of a major portion in FIG. 7A.

With the examples of FIGS. 8 and 9 wherein the non-symmetrical frequency characteristic is assured by the electrode fingers of the single finger type, it is possible to make up a filter of a higher frequency, i.e., approximately twice as high, than that available through the mirror method or reflection method in FIG. 7 even if the electrode width is equal.

Figure 10:
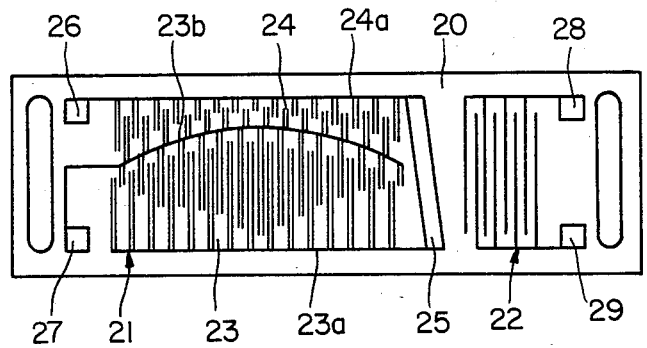

FIG. 10 shows still another modification in the first embodiment of FIG. 8, with the difference in that the respective interdigital electrodes 23 and 24 are of the double finger type which is effective to eliminate Triple Transit Echo. For this example, it is possible to make equal the lengths of the respective electrode fingers in the electrode sets and remarkably decrease calculation error as compared with the conventional mirror method (the reflection method, or odd/even function method).

Figure 11:
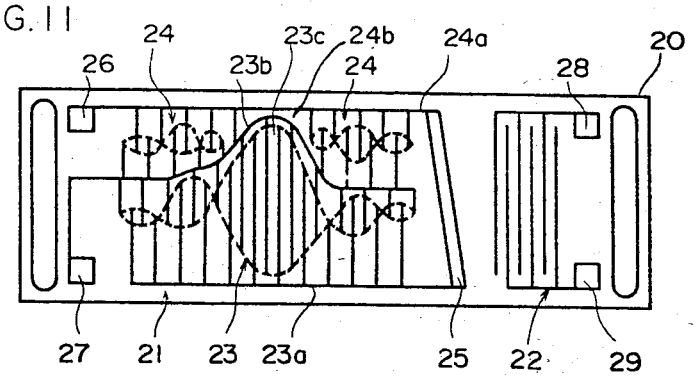

FIG. 11 is a plan view of a surface acoustic wave filter according to a second embodiment of the present invention. The second interdigital electrode 24 specifying the odd components in FIG. 4 is designed such that there is a zero exciting source (i.e., a region where the wave amplitude is zero) in the neighborhood of an exciting source 23c a region where the wave amplitude is at a relative maximum) at the maximum overlapping length of the first interdigital electrode 23, the zero exciting source being positioned outside the common electrode portion 23b of the first interdigital electrode 23 and thus within the non-overlapping region for the even components and on propagation paths in the first interdigital electrode 23. The dashed lines in FIGS. 11–16 and 18–22 represent a schematic envelope of the interdigital electrodes; that is, the lines indicated the waveform of a standing wave.

The second interdigital electrode 24 comprises electrode fingers stretching from the common electrode portion 23b of the first interdigital electrode 23 and another common electrode portion 24a in the neighborhood of the exciting source 23c at the maximum overlapping length of the first interdigital electrode 23. In the embodiment of FIG. 11, there is no exciting source for the second interdigital electrode in the area adjacent the exciting source 23c (i.e., in area 23b) at the maximum overlapping length of the first electrode 23, thus permitting the width of the substrate to be reduced by that extent. This relationship can be expressed as follows. The first interdigital electrode 23 lies within a rectangular area having a length (defined by the maximum extent of the overlapping electrode fingers of the electrode 23 as measured along the propagating direction of the acoustic waves) and a height (defined by the maximum distance between the electrode portions 23a, 23b as measured along a direction perpendicular to said propagation direction). The second interdigital electrode 24 has overlapping electrode fingers located only within this rectangular area but outside the areas where the electrode fingers of the first interdigital electrodes 23 overlap.

The following will set forth a way to minimize to zero an exciting source in the neighborhood of the exciting source 23c at the maximum overlapping length of the first interdigital electrode 23.

Assuming that the desired frequency characteristic is represented by equation (3), the impulse response thereof is as follows and exhibits a characteristic curve as plotted in FIG. 14.

$$h(t) = h_R(t) - jh_I(t) \qquad (4)$$

-continued
$$= \int H_R(\omega)e^{j(2\pi ft+\phi)}df - \int jH_I(\omega)e^{j(2\pi ft+\phi)}df$$

Figure 1:
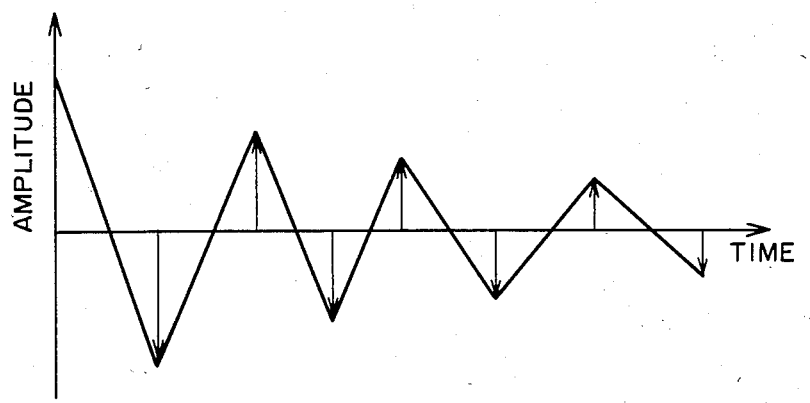
FIG. 1 shows an impulse response characteristic of a conventional interdigital electrode of a variable electrode pitch type.
Figure 14:
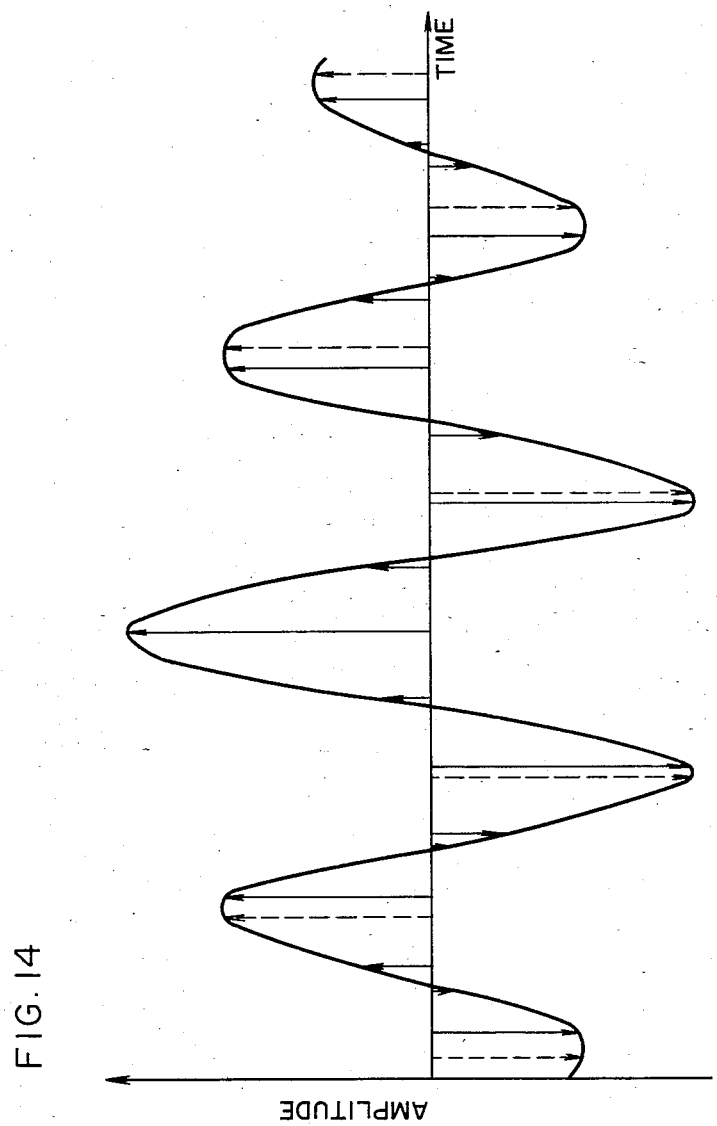
FIG. 14 is an impulse response characteristic chart for explaining the electrode pattern according to the second embodiment of the present invention.

It is understood that FIG. 14 is not plotted exactly in the same manner as FIGS. 1, 4 and 5 for the sake of clarity of explanation. According to the conventional method, such as the reflection method, data are sampled at a time interval of $t = \frac{1}{2}f_0$ as denoted by the solid line arrows) in FIG. 14 and the interdigital electrode 23 for the even components is designed based upon the even components of the data and the interdigital electrode 24 for odd components based upon the odd components of the data. The same electrode design is also used in the case of the odd/even function method. Pursuant to the teachings of the present invention, on the other hand, the even components or odd components may be varied and, for example, the exciting source of the odd components in the area of the maximum amplitude of the even components may be decreased by somewhat varying the sampling time interval. In other words, should sampling be effected at a time interval of $t' = \frac{1}{2}(f_0 + \Delta f)$, the odd components is decrease as indicated by the dotted lines in FIG. 14. Furthermore, if the maximum value of the exciting intensity is set at a relative scale of 1, then any exciting source of less than some value, for example, 0.02 is forced to zero. Of course, in the case that the exciting source is reduced to zero, compensation is effected by other exciting sources. The electrode arrangement of FIG. 11 is made up according to the second embodiment of the present invention, which is different than the conventional method.

In the embodiment of FIG. 11, no exciting sources are established in the area of the maximum overlapping length of the first electrode 23 except the exciting source 23c with a result that the width of the substrate can be minimized by positioning the respective exciting sources of the second electrode 24 to assume its maximum exciting intensity, for example, in the neighborhood of the central portion thereof. Moreover, less or no influence of diffraction loss or the like is observed since the second interdigital electrode 24 is essentially concentrated at the central portion where the exciting intensity is high.

Figure 12:
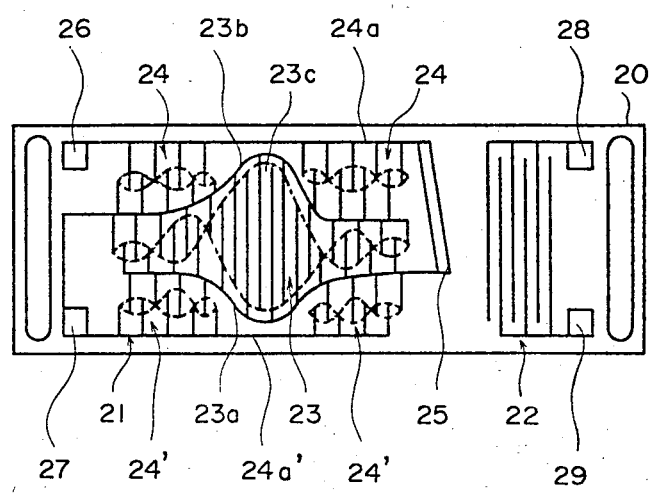
Figure 13:
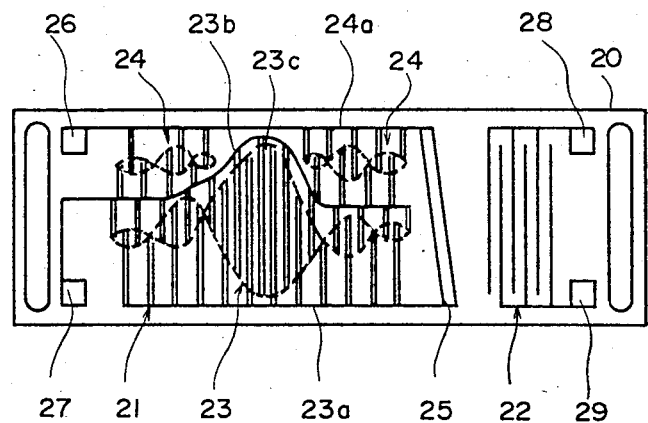

As with the first embodiment described above, the second embodiment of the present invention as shown in FIG. 11 may be adapted such that the second interdigital electrode 24, 24' is disposed on both sides of the first interdigital electrode 23 as seen in FIG. 12. It is further possible that the respective interdigital electrodes 23 and 24 may be made up by electrode fingers of the double finger type as seen in FIG. 13.

Figure 15:
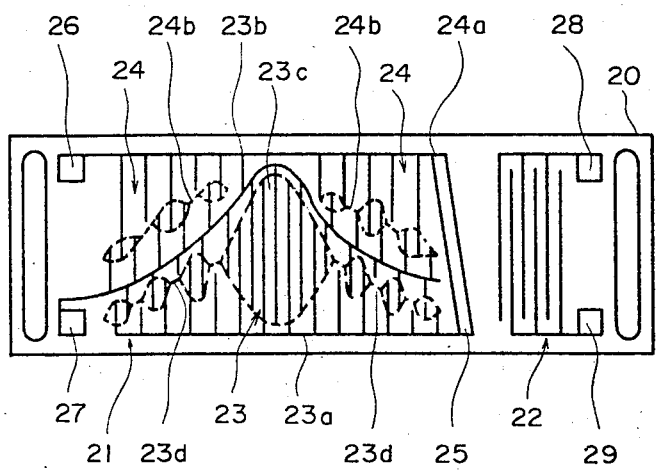

Referring to FIG. 15, there is illustrated a third, preferred, embodiment of the present invention. Although the electrode pattern is designed dependent upon the impulse response in FIG. 4, this embodiment is adapted such that zero exciting sources 23d included in the first interdigital electrode 23 are distributed in different positions along the longitudinal direction of the electrode fingers and the envelope of the first interdigital electrode is inclined right and left with respect to the exciting source 23c at the position where the fingers extend a maximum overlapping length (the right and left directions mean those on the drawing sheet) through weighting of the overlapping length. The electrode portion 23b in the first interdigital electrode 23 is disposed substantially along the inclined envelope. The second interdigital electrode 24 specifying the odd components in FIG. 4, on the other hand, is adapted such that there is at least one zero exciting source in the neighborhood of the exciting source 23c at the maximum overlapping length of the first electrode 23, with the peripheral electrode fingers omitted therefrom and a plurality of zero exciting sources distributed in different positions along the longitudinal direction of the electrode fingers. The remaining zero exciting sources of the second interdigital electrode 24 are so located within the non-overlapping region of the first interdigital electrode 23 and on propagating paths on the electrode 23 as to extend substantially along the inclined envelope of the first interdigital electrode 23. With such an arrangement, the respective exciting sources of the second interdigital electrode 24 may be concentrated at the positions along the length of the electrode fingers where the exciting intensity is a maximum in a direction perpendicular to the propagating direction of the surface waves, for example, in the neighborhood of the central portion of the electrode.

Figure 16:
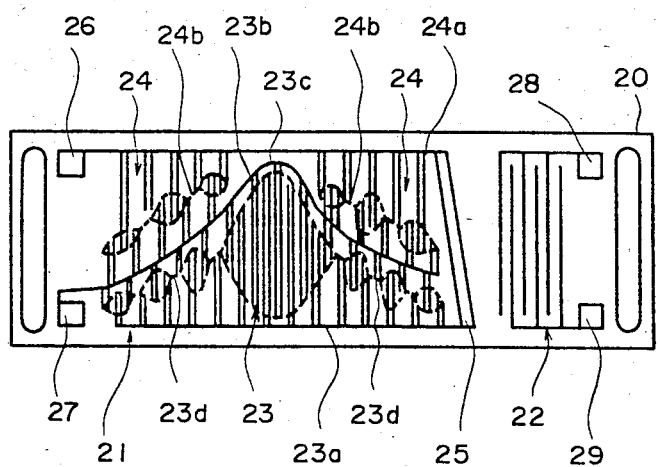

In a manner similar to the first and second embodiments, the third embodiment shown in FIG. 15 may be adapted such that the respective interdigital electrodes 23 and 24 are of electrode fingers of the double finger type, as seen from FIG. 16. This arrangement is useful in eliminating TTE.

Figure 17:
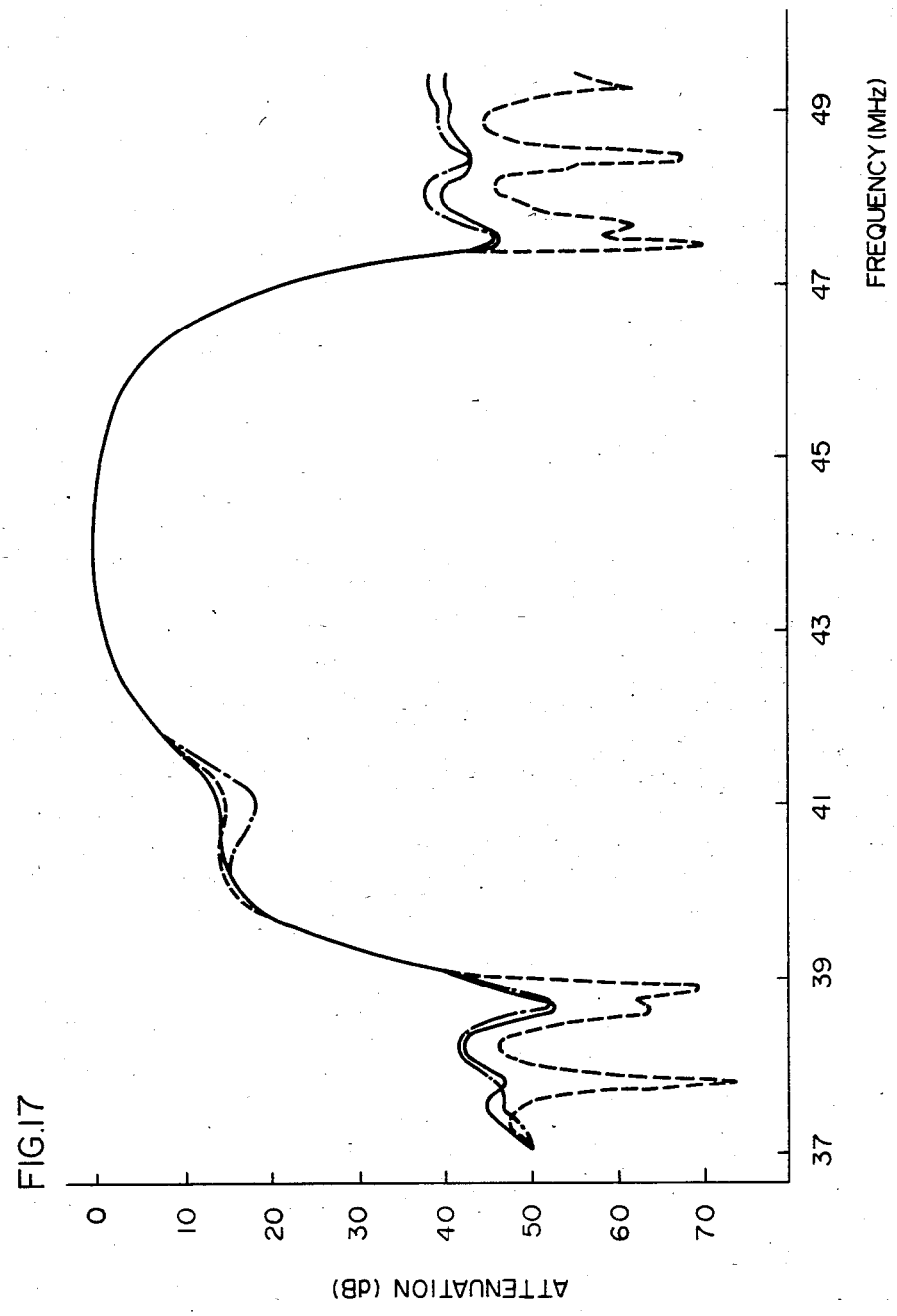
FIG. 17 is a chart indicating frequency response characteristic of a surface acoustic wave filter according to a third embodiment of the present invention.

FIG. 17 is a chart describing a frequency response characteristic (as denoted by solid line) of the surface acoustic wave filter according to the present invention as suggested in FIG. 16. In FIG. 17, there are further illustrated a frequency response characteristic (as denoted by the dotted line) plotted based upon theoretical values and a frequency characteristic (as denoted by the broken line) of the surface acoustic wave filter disclosed in U.S. Pat. No. 3,968,461 for comparison. It is obvious from FIG. 17 that the surface acoustic wave filter embodying the present invention exhibits very close correlation with the frequency response characteristic curve available from the theoretical values and thus a distinguished characteristic over the surface acoustic wave device disclosed in the prior patent. Furthermore, the frequency response characteristic is improved especially in the vicinity of the sound trap with the surface acoustic wave filter.

Figure 18:
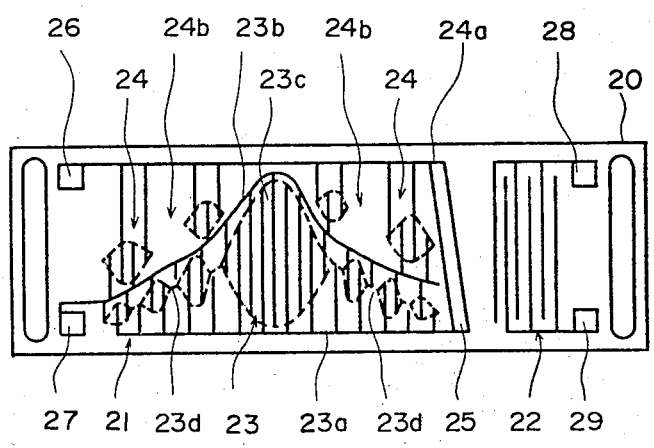

FIG. 18 is a plan view showing a fourth embodiment of the present invention. The fourth embodiment of the present invention shown in FIG. 18 is essentially similar to the third embodiment in FIG. 15, with the difference in the manner of setting up the respective zero exciting sources 24b of the second interdigital electrode 23. That is, in the embodiment of FIG. 18, the zero exciting sources 24b are formed without positioning the electrode fingers at the locations of those zero exciting sources. In this manner, it is possible to form the zero exciting sources 24b without the electrode fingers and distribute the respective ones of the overlapping regions of the second interdigital electrode on the substrate with great flexibility.

Figure 19:
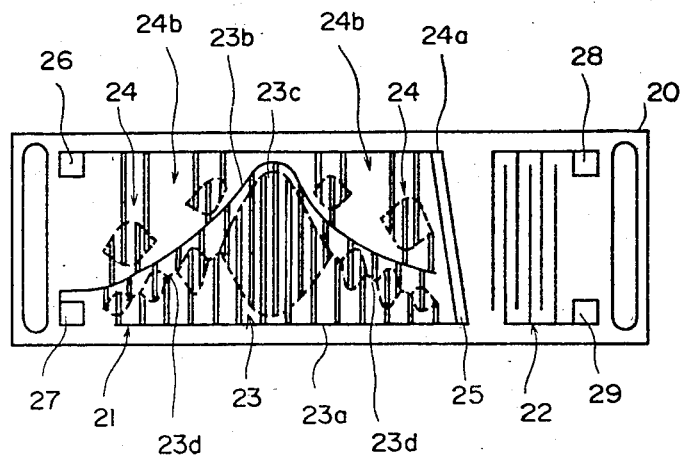
Figure 20:
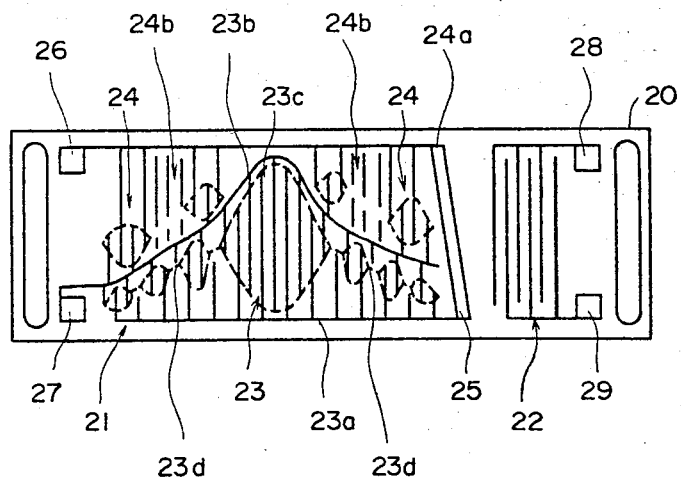

In the fourth embodiment of the present invention as in FIG. 18, an electrode pattern may also be drawn using the interdigital electrodes of the so-called double finger type as seen from FIG. 19. Furthermore, at least portions of the electrode fingers of the zero exciting source 24b may be isolated without connection to any one of the common electrode portions 24a and 23b and held in floating state, as understood from FIG. 20.

Figure 21:
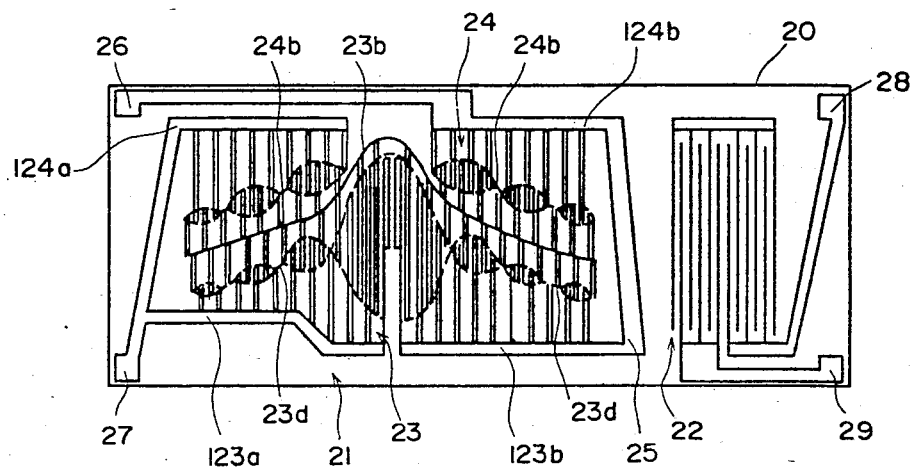
Figure 22:
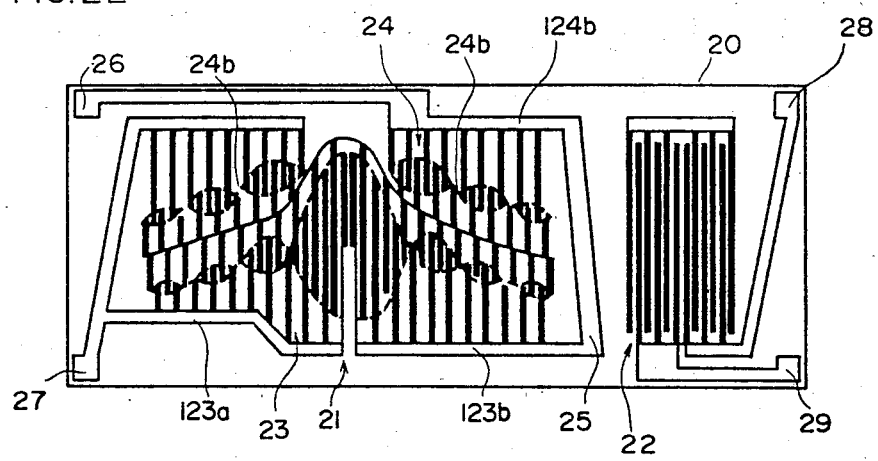

In FIG. 21, there is illustrated a plan view of a fifth embodiment of the present invention. It is noted that the first interdigital electrode 23 and the second interdigital electrode 24 are respectively divided into two electrode segments. In other words, the individual electrode sets in the first interdigital electrode 23 are connected to its associated common electrode portions 123a and 123b, while the individual electrode sets in the second interdigital electrode 24 are connected to its associated common electrode portions 124a and 124b. The common electrode portions 123a and 124a are connected to each other and led to the terminal electrode 27, while the common electrode portions 123b and 124b. are connected to each other and led to the terminal electrode 26. In the embodiment of FIG. 21, the capacities of the first and second interdigital electrodes 23 and 24 are respectively a series of capacities of the two electrode segments. This implies that the impedance of this surface acoustic wave filter is four times as high as those of the first to fourth embodiments of the present invention.

In the embodiment of FIG. 21 like the previous embodiments, the interdigital electrodes 23 and 24 may be set up by electrode fingers of the so-called single finger type. An example thereof is shown in a plan view of FIG. 22.

Although in the foregoing embodiments the interdigital electrodes have been described and shown as having the very simple envelope, it is obvious that the present invention is equally applicable to the interdigital electrodes whatever shape the envelope has. It is to be pointed out that the even components and odd components throughout the present disclosure are referred collectively to indicate the even components and odd components in the odd/even function method and the symmetrical components and non-symmetrical components in the reflection method and so forth. Furthermore, in the case that the maximum overlapping length is on the odd function side as a consequence of phase compensation design, the above described technology must be used on the even function side.

Whereas the foregoing has been directed to the VIF filter for use in the television receivers, other possible applications of the present invention cover delay lines and other surface wave devices.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A surface acoustic wave device, comprising:
   (A) a piezoelectric substrate for propagating acoustic waves;
   (B) input and output side electrodes disposed on a surface of said substrate and located laterally with respect to one another along a propagating direction of said acoustic waves;
   (C) at least one of said input and output side electrodes comprising first and second interdigital electrodes:
   (i) said first interdigital electrode including a pair of comb electrodes, each of said comb electrodes of said first interdigital electrode including a respective common electrode extending generally along said propagating direction and a plurality of electrode fingers coupled thereto, each of said electrode fingers extending in a direction generally perpendicular to said propagating direction, each of said fingers overlapping adjacent fingers of the remaining comb electrode of the pair, the overlapping length of adjacent fingers being so weighted as to define one of odd and even components of a desired frequency characteristic, said first interdigital electrode lying within an imaginary rectangle whose length is defined by the distance between the most distant electrode fingers of said first interdigital electrode as measured in said propagating direction and whose width is defined by maximum distance between said common electrodes as measured along said direction perpendicular to said propagating direction;
   (ii) said second interdigital electrode including a pair of comb electrodes, each of said comb electrodes including a respective common electrode extending generally along said propagating direction and a plurality of electrode fingers coupled thereto, said electrode fingers extending in a direction generally perpendicular to said propagating direction, each of said fingers of said second interdigital electrode overlapping adjacent fingers of the remaining comb electrode of said second interdigital electrode, the overlapping length of adjacent fingers being so weighted as to define the other of said odd and even components of said desired response frequency characteristic, said overlapping portions of said electrode fingers of said second interdigital electrode lying entirely within said imaginary rectangle but outside said overlapping region of said fingers of said first interdigital electrode.

2. A surface acoustic wave device in accordance with claims 1, wherein said second interdigital electrode includes a region defining a zero-exciting source in the neighborhood of a region defining an exciting source of said first interdigital electrode, said exciting source being located at the area where the overlapping length of said first interdigital electrode is at a maximum.

3. A surface acoustic wave device in accordance with claim 2, wherein said second interdigital electrode includes a plurality of regions defining exciting sources of said second interdigital electrode and wherein those exciting sources of said second interdigital electrode other than said zero-exciting source are disposed within said imaginary rectangle but outside said overlapping region of said fingers of said first interdigital electrode but in the proximity of said first interdigital electrode to assume the maximum exciting intensity in a direction perpendicular to the propagating direction of the surface waves.

4. A surface acoustic wave device in accordance with the claim 1 wherein said second interdigital electrode includes a plurality of areas defining exciting sources and distributed along a direction perpendicular to the propagating direction of the surface waves.

5. A surface acoustic wave device in accordance with claim 4 wherein said second interdigital electrode has at least one zero-exciting source in the proximity of an area of said first interdigital electrode defining an exciting source of said first interdigital electrode, said area of said first interdigital electrode being located at the maximum overlapping length of said first interdigital electrode.

6. A surface acoustic wave device in accordance with claim 1 wherein at least one of said first interdigital electrode and said second interdigital electrode comprises two interdigital electrode segments.

7. A surface acoustic wave device in accordance with claim 1 wherein said first interdigital electrode and said second interdigital electrode each comprise a plurality of electrode fingers of the double finger type.

8. A surface acoustic wave device in accordance with claim 2 wherein said first interdigital electrode and said second interdigital electrode each comprise a plurality of electrode fingers of the double finger type.

9. A surface acoustic wave device in accordance with claim 3 wherein said first interdigital electrode and said second interdigital electrode each comprise a plurality of electrode fingers of the double finger type.

10. A surface acoustic wave device in accordance with claim 4 wherein said first interdigital electrode and said second interdigital electrode each comprise a plurality of electrode fingers of the double finger type.

11. A surface acoustic wave device in accordance with claim 5 wherein said first interdigital electrode and said second interdigital electrode each comprise a pluratity of electrode fingers of the double finger type.

12. A surface acoustic wave device in accordance with claim 6 wherein said first interdigital electrode and said second interdigital electrode each comprise a plurality of electrode fingers of the double finger type.

13. A surface acoustic wave device in accordance with claim 1 wherein said first interdigital electrode and said second interdigital electrode each comprise a plurality of electrode fingers of the single finger type.

14. A surface acoustic wave device in accordance with claim 2 wherein said first interdigital electrode and said second interdigital electrode each comprises a plurality of electrode fingers of the single finger type.

15. A surface acoustic wave device in accordance with claim 3 wherein said first interdigital electrode and said second interdigital electrode each comprises a plurality of electrode fingers of the single finger type.

16. A surface acoustic wave device in accordance with claim 4 wherein said first interdigital electrode and said second interdigital electrode each comprise a plurality of electrode fingers of the single finger type.

17. A surface acoustic wave device in accordance with claim 5 wherein said first interdigital electrode and said second interdigital electrode each comprise a plurality of electrode fingers of the single finger type.

18. A surface acoustic wave device in accordance with claim 6 wherein said first interdigital electrode and said second interdigital electrode each comprise a plurality of electrode fingers of the single finger type.

* * * * *